United States Patent
Yabuta et al.

(10) Patent No.: US 8,513,662 B2
(45) Date of Patent: Aug. 20, 2013

(54) SEMICONDUCTOR DEVICE AND DISPLAY APPARATUS

(75) Inventors: Hisato Yabuta, Machida (JP); Masato Ofuji, Honjo (JP); Yasuyoshi Takai, Kawasaki (JP); Takehiko Kawasaki, Kamakura (JP); Norio Kaneko, Atsugi (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 338 days.

(21) Appl. No.: 12/992,071

(22) PCT Filed: May 11, 2009

(86) PCT No.: PCT/JP2009/059104
§ 371 (c)(1),
(2), (4) Date: Nov. 10, 2010

(87) PCT Pub. No.: WO2009/139483
PCT Pub. Date: Nov. 19, 2009

(65) Prior Publication Data
US 2011/0062441 A1    Mar. 17, 2011

(30) Foreign Application Priority Data
May 12, 2008    (JP) ................... 2008-124858

(51) Int. Cl.
*H01L 29/72*    (2006.01)
(52) U.S. Cl.
USPC ............. 257/43; 257/10; 257/53; 257/59; 257/E33.004; 257/E33.037; 257/E33.053
(58) Field of Classification Search
USPC .......... 257/10, 43, 53, 59, E33.004, E33.037, 257/E33.053
See application file for complete search history.

(56) References Cited

U.S. PATENT DOCUMENTS

| | | | |
|---|---|---|---|
| 5,079,606 | A | 1/1992 | Yamamura et al. |
| 6,573,161 | B1 | 6/2003 | Miyasaka et al. |
| 7,189,992 | B2 | 3/2007 | Wager, III et al. |
| 7,242,039 | B2 | 7/2007 | Hoffman et al. |
| 7,282,782 | B2 | 10/2007 | Hoffman et al. |

(Continued)

FOREIGN PATENT DOCUMENTS

| | | |
|---|---|---|
| JP | 10-209460 A | 8/1998 |
| JP | H10-209460 A | 8/1998 |
| JP | 2006-024862 A | 1/2006 |
| JP | H09-213965 A | 1/2006 |

OTHER PUBLICATIONS

Barquinha et al., J. Non-Cryst. Sol., Amsterdam, NL, vol. 352, No. 1756 (2006), XP025187662.

(Continued)

*Primary Examiner* — Edward Wojciechowicz
(74) *Attorney, Agent, or Firm* — Canon U.S.A., Inc. IP Division

(57) ABSTRACT

Provided is a semiconductor device including a semiconductor element including at least a semiconductor as a component characterized by including: a mechanism for irradiating the semiconductor with light having a wavelength longer than an absorption edge wavelength of the semiconductor; and a dimming mechanism, provided in a part of an optical path through which the light passes, for adjusting at least one factor selected from an intensity, irradiation time and the wavelength of the light, wherein a threshold voltage of the semiconductor element is varied by the light adjusted by the dimming mechanism.

15 Claims, 10 Drawing Sheets

(56) References Cited

U.S. PATENT DOCUMENTS

| | | |
|---|---|---|
| 7,297,977 B2 | 11/2007 | Hoffman et al. |
| 2007/0194379 A1 | 8/2007 | Hosono et al. |
| 2012/0211741 A1* | 8/2012 | Kato et al. ............... 257/40 |

OTHER PUBLICATIONS

Yabuta et al., Appl. Phys. Lett., 89, 112123 (2006).

T. Riedl, et al, Phys. Stat. Sol., 1, 175 (2007).

Kim et al., International Electron Device Meeting 2006 (IEDM'06), 11-13, 1 (2006).

P. Gorrn, et al., XP002528977, Applied Physics Letters 91, 193504 (2007).

P. Gorrn, et al., XP012095982, Applied Physics Letters 90, 063502 (2007).

* cited by examiner

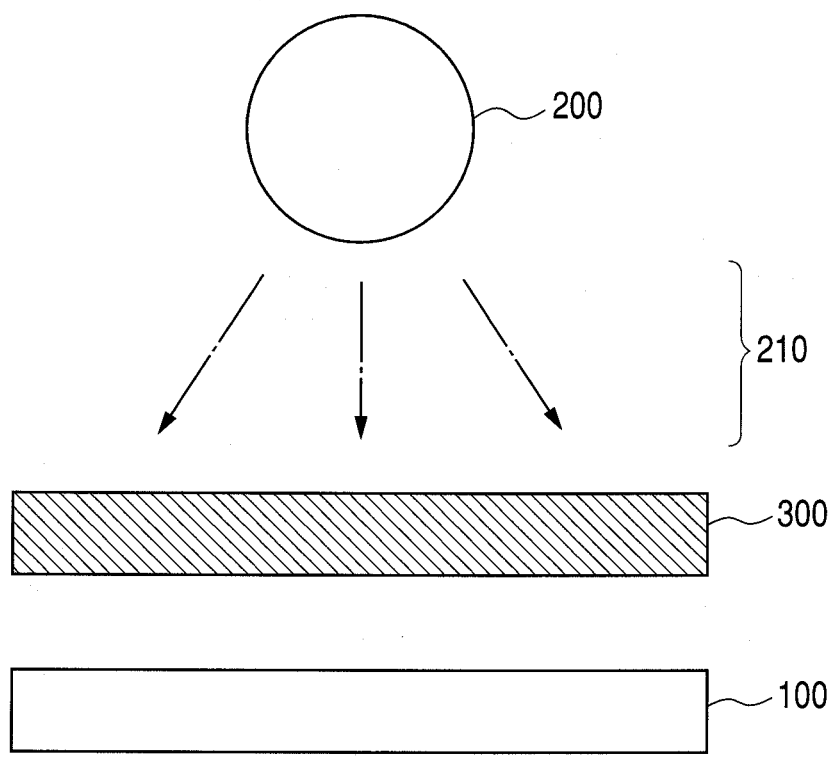
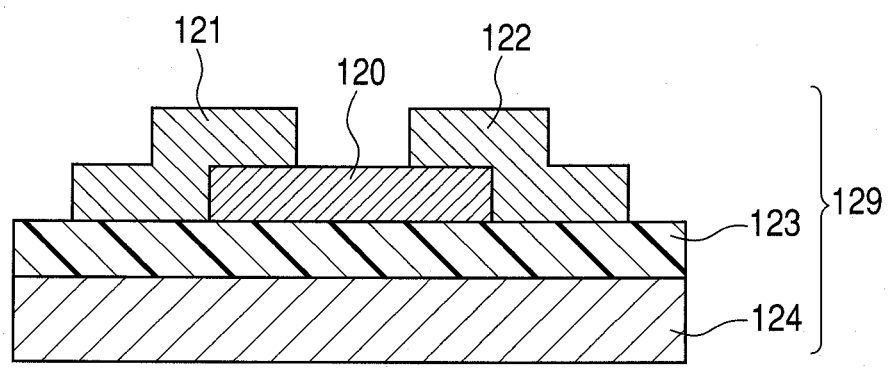

| CONDITION | | $V_{th}$ (V) | $\mu_{sat}$ (cm$^{-2}$V$^{-1}$s$^{-1}$) | S (Vdec$^{-1}$) |
|---|---|---|---|---|
| (1-1) | DARK-ADAPTIVE AMBIENCE | 4.9 | 12.8 | 0.6 |

FIG. 13

| CONDITION | | V$_{th}$ (V) | $\mu_{sat}$ (cm$^2$V$^{-1}$s$^{-1}$) | S (Vdec$^{-1}$) |
|---|---|---|---|---|
| (4-1) | DARK-ADAPTIVE AMBIENCE (BEFORE LIGHT-IRRADIATING) | 4.0 | 11.8 | 0.6 |
| (4-2) | DARK-ADAPTIVE AMBIENCE (400nm, 0.2mWcm$^{-2}$ AFTER LIGHT-IRRADIATING) | 2.5 | 11.6 | 0.6 |
| (4-3) | DARK-ADAPTIVE AMBIENCE (AFTER APPLYING Vds= +20V, Vgs= +20V 3600s) | 3.5 | 12.0 | 0.6 |

SEMICONDUCTOR DEVICE AND DISPLAY APPARATUS

TECHNICAL FIELD

The present invention relates to a semiconductor device.

BACKGROUND ART

Currently, in an attempt to enhance the performance of thin-film transistors (TFTs), and lower the temperature and costs of the manufacturing process of it, a broad range of materials have been researched and studied for channel layer materials. Examples of the materials include amorphous silicon, polycrystalline silicon, microcrystalline silicon and organic semiconductors.

Oxide semiconductors, which have recently been discovered, are also a prevailing group for the materials. For example, Barquinha et al., J. Non-Cryst. Sol., 352, 1756 (2006) and Yabuta et al., Appl. Phys. Lett., 89, 112123 (2006) disclose a TFT fabricating method using an amorphous In—Zn—O (IZO) thin film and an amorphous In—Ga—Zn—O (IGZO) thin film, respectively, for a channel layer.

TFTs have different threshold voltages depending on the semiconductor material for the channel layer and/or the manufacturing method. Also, the threshold voltage of a TFT varies due to various causes (such as manufacturing process history, temporal change, electrical stress and thermal stress). Here, electrical stress refers to stress occurring upon application of a voltage or current to a semiconductor. Also, thermal stress refers to stress occurring upon heating the area around a semiconductor from the outside, or by Joule heat generated upon application of a current to the semiconductor. These two types of stress may simultaneously be imposed on a TFT during operation.

Even TFTs using the above oxide semiconductors as a channel layer are no exception: Riedl et al., Phys. Stat. Sol., 1, 175 (2007) and Kim et al., International Electron Device Meeting 2006 (IEDM'06), 11-13, 1 (2006) indicate that a threshold voltage variation due to electrical stress or a combination of electrical stress and thermal stress has been observed.

Furthermore, Barquinha et al., J. Non-Cryst. Sol., 352, 1756 (2006) discloses that the threshold voltage of an oxide semiconductor TFT varies upon visible light and ultraviolet light irradiation. Also, for polycrystalline silicon, Japanese Patent Application Laid-Open No. H10-209460 discloses a method for reducing the threshold voltage of a TFT by providing a structure that allows light to enter the channel layer of the TFT.

DISCLOSURE OF THE INVENTION

However, none of the aforementioned documents clarifies a method for compensating for or suppressing a threshold voltage variation due to the aforementioned causes or a method for relatively reducing the effect of the threshold voltage variation.

Accordingly, in general, in the case of a conventional element using an amorphous silicon semiconductor and a device using the element, a countermeasure is not taken directly for the semiconductor channel layer, but is taken by providing a circuit for correcting the threshold voltage variation that has occurred is separated provided. This correction circuit allows the device to operate normally even when a threshold voltage variation occurs in the semiconductor. However, such correction circuit is a complicated circuit including a semiconductor element, and thus, as a result of separately providing this correction circuit, the entire circuit becomes larger in size and complicated, and the manufacturing costs are also increased. Also, if the threshold voltage variation becomes extremely large, it is difficult to correct such threshold voltage variation with the correction circuit alone.

When the threshold voltage varies due to the aforementioned causes, the characteristics other than the threshold voltage, such as the charge mobility and the subthreshold swing (S value), vary with the variation. For example, Japanese Patent Application Laid-Open No. H10-209460 and Barquinha et al., J. Non-Cryst. Sol., 352, 1756 (2006) report that the mobility is increased or decreased simultaneously with a decrease in threshold voltage, respectively. It is desirable to keep these characteristics equal to those before the variation; however, no means has been known to enable doing so.

The present invention has been made in view of the aforementioned problems, and an object of the present invention is to provide a semiconductor device enabling compensation for or suppression of a threshold voltage variation in a semiconductor by providing a mechanism for irradiating the semiconductor with light having a wavelength longer than the absorption edge wavelength of the semiconductor, and an adjustment mechanism for the light.

The present invention is directed to a semiconductor device including a semiconductor element including at least a semiconductor as a component, the semiconductor device comprising:

a mechanism for irradiating the semiconductor with light having a wavelength longer than an absorption edge wavelength of the semiconductor; and a dimming mechanism, provided in a part of an optical path through which the light passes, for adjusting at least one selected from the intensity, irradiation time and wavelength of the light, wherein a threshold voltage of the semiconductor element is varied by the light adjusted by the dimming mechanism.

The dimming mechanism can absorb or block light with a wavelength shorter than the absorption edge wavelength of the semiconductor.

The dimming mechanism can be provided between a light source for light irradiation and the semiconductor.

The dimming mechanism can include one element selected from a liquid-crystal element, an electrochromic element, a color filter and an electro-optic effect element.

The dimming mechanism can detect a variation in the threshold voltage of the semiconductor element, and adjusts the light based on the detected variation.

The light irradiation can be performed before driving of the semiconductor device.

The light irradiation can be performed during driving of the semiconductor device or after termination of the driving.

The semiconductor element can include at least a gate electrode, a source electrode, a drain electrode, a channel layer and a gate insulation film; and the semiconductor is the channel layer.

In the semiconductor device, a surface density of in-gap states in the semiconductor can be no more than $10^{13}$ cm$^{-2}$ eV$^{-1}$.

The semiconductor can be a semiconductor with a band gap of no less than 1.55 eV.

The semiconductor can contain at least one element selected from In, Ga, Zn and Sn.

The semiconductor can be of amorphous In—Ga—Zn—O (IGZO), amorphous In—Zn—O (IZO) or amorphous Zn—Sn—O (ZTO).

The semiconductor can contain at least one type of element selected from elements belonging to groups I to XIV in the periodic table, and antimony and bismuth; and a number of oxygen atoms equal to or exceeding a total number of atoms for the element.

The present invention is directed to a display apparatus using the semiconductor device for a drive element for the display apparatus.

The display apparatus can be an image display apparatus including a backlight light source; and the mechanism for irradiating the semiconductor with light having a wavelength longer than an absorption edge wavelength of the semiconductor is the backlight light source.

The semiconductor element can be a thin-film transistor; and the thin-film transistor is connected to a mechanism for detecting a TFT characteristic of the thin-film transistor; and the dimming mechanism adjusts the light based on the TFT characteristic detected by the mechanism for detecting a TFT characteristic.

The semiconductor device according to the present invention enables the threshold voltage of a semiconductor included in a semiconductor element to be varied so as to be close to its original state when a threshold voltage variation occurs in the semiconductor. Accordingly, the semiconductor device can normally operate all the time.

Also, use of the present invention enables suppression of or compensation for a threshold voltage variation in a semiconductor before occurrence of such threshold voltage variation, allowing the semiconductor device to operate normally.

Furthermore, the present invention enables normal operation of a semiconductor device merely by means of providing mechanisms with a simple configuration, compared to the conventional methods using a correction circuit for threshold voltage variations. Consequently, an increase in manufacturing costs can be suppressed.

Furthermore, using the present invention together with a conventional correction circuit enables normal operation of a semiconductor device even when a large threshold voltage variation beyond the correction capability of the conventional correction circuit alone occurs.

Furthermore, even when characteristics of a semiconductor element other than the threshold voltage, such as the charge mobility and/or the S value, vary together with a threshold voltage variation, the present invention enables recovery to characteristics close to those before the variation.

Further features of the present invention will become apparent from the following description of exemplary embodiments with reference to the attached drawings.

BRIEF DESCRIPTION OF THE DRAWINGS

FIG. 1 is a diagram schematically illustrating characteristics of the present invention;

FIG. 2 is a cross-sectional view of a TFT to which the present invention can be applied;

FIG. 13 is a diagram illustrating recovery of characteristics of semiconductor elements upon light irradiation of the semiconductor elements before a period of time in which a threshold voltage variation occurs;

BEST MODES FOR CARRYING OUT THE INVENTION

Figure 3:
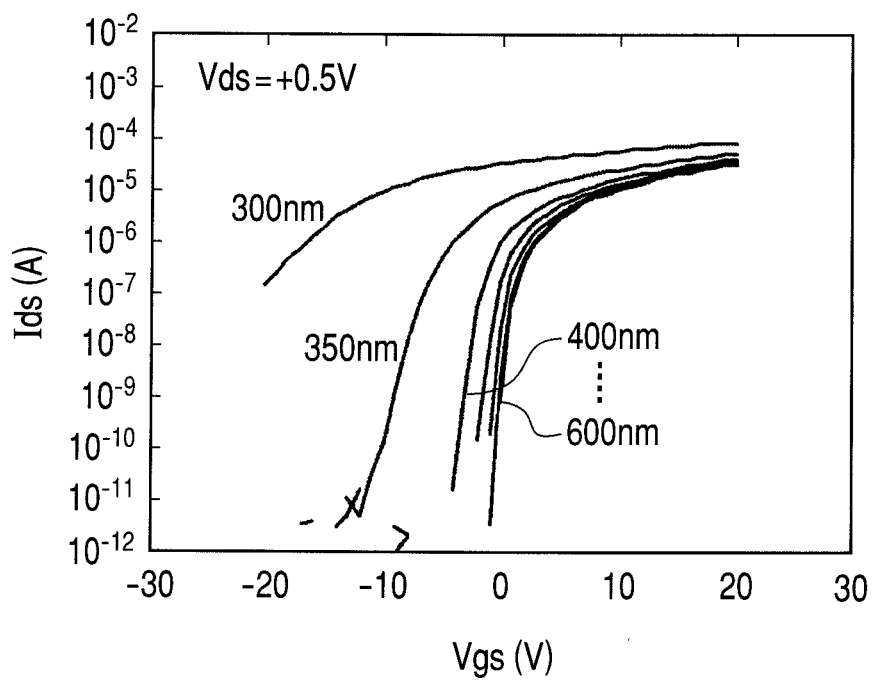
FIG. 3 is a diagram illustrating an effect of light irradiation on the transfer characteristic of a TFT to which the present invention can be applied.

First, a mechanism for processing a semiconductor, which is a component of a semiconductor device according to the present invention, will be described.

FIG. 1 is a diagram schematically illustrating the present invention. The Figure illustrates application of light 210 from a light source 200 to a semiconductor 100. A dimming mechanism 300 is arranged in a part of the optical path through which the light 210 passes to reach the semiconductor 100. The present invention is characterized by suppressing or changing a threshold voltage variation occurring in a semiconductor by irradiating the semiconductor with light as described above.

Here, the semiconductor 100 may be in any shape. Also, the semiconductor 100 may be a part of a semiconductor element formed by combining the semiconductor 100 and other component materials (such as electrodes and insulators) (not illustrated). For example, the semiconductor 100 may take the form of a semiconductor thin film, which is used as a channel layer in a TFT.

Also, the light source 200 may be in any shape. For the light source, a hot filament, a fluorescent tube, discharge, a light-emitting diode, etc., can be employed. The light source may be provided specifically for semiconductor irradiation, or a light source originally provided for a purpose other than semiconductor irradiation, such as a backlight provided in a liquid-crystal display, may be used. Also, environment light, such as sunlight or interior illumination light, can be used. Furthermore, as long as a desired effect can be provided, there is no need to arrange the semiconductor 100 and the light source 200 so as to face each other as illustrated in the Figure.

The dimming mechanism 300 includes a mechanism for adjusting at least one of the irradiation time, the intensity and wavelengths of light. For such dimming mechanism, a liquid-crystal element, an electrochromic element, a color filter, an electro-optic effect element, etc., can be used. Furthermore, as mentioned above, the dimming mechanism 300 is required to be arranged in a part of the optical path of the light 210 applied to the semiconductor 100. For example, when a light source and a semiconductor are arranged facing each other as illustrated in FIG. 1, the dimming mechanism 300 is arranged between the light source and the semiconductor.

Next, the details of correction of a threshold voltage variation in the semiconductor by means of light irradiation will be described.

The threshold voltage of the semiconductor 100 varies due to at least one of the causes such as temporal change, electrical stress and thermal stress. In the present invention, a threshold voltage variation due to the aforementioned cause are suppressed or varied by irradiating the semiconductor 100 with the light 210 from the light source 200. In this case, at least one of the irradiation intensity, time and wavelengths of the light 210 is adjusted by the dimming mechanism 300. In particular, for the wavelengths, the light is adjusted to have wavelengths longer than the absorption edge wavelength of the semiconductor 100 (wavelength with the lowest energy in light absorption based on interband transition of free carriers in the semiconductor) and applied to the semiconductor 100. Consequently, the semiconductor 100 can recover to have the characteristics close to those before occurrence of the threshold voltage variation. This can be considered due to, for example, fixed charges such as carriers trapped in or around the semiconductor being released by the light irradiation.

In light irradiation of a semiconductor as described above, it is desirable to detect a variation in the element characteristics, such as the threshold voltage, of a semiconductor element using the semiconductor during use of the semiconductor element, and adjust at least one of the intensity, time and wavelengths of the irradiation light according to the variation. In this case, it is desirable to use any of a liquid-crystal element and an electrochromic element, which can electrically change the intensity and wavelengths of transmitted light, an electrochromic element, and a dielectric element exhibiting an electro-optic effect, as the dimming mechanism 300. Also, the dimming mechanism 300 using one of these elements may be provided with a mechanism for adjusting the irradiation time of light by electrically hindering light transmission.

For light irradiation of the semiconductor, regardless of detection of a characteristic variation in the semiconductor element due to the aforementioned cause, a characteristic variation after operation of the semiconductor element may be estimated in advance to irradiate the semiconductor element with the amount of light to recover from the characteristic variation to be expected. In other words, irradiation may be performed during the semiconductor device being driven. For the dimming mechanism for adjusting the intensity or wavelengths of irradiation light in this case, it is desirable to use a color filter. A color filter selectively transmits light in a necessary wavelength band only, and also causes adequate intensity attenuation of transmitted light. Accordingly, a color filter is suitable for a dimming mechanism for adjusting the intensity or wavelengths of light applied to a semiconductor in a semiconductor device according to the present invention. Also, a color filter has the shape of a film or plate, which is suitable for being arranged in the inside of the device. Furthermore, color filters are generally inexpensive, enabling suppression of an increase in the costs due to provision of a dimming mechanism as much as possible.

As for the timing for light irradiation of the semiconductor in this case, light irradiation can be performed during the period of time in which a threshold voltage variation due to the aforementioned cause is occurring. For example, the case where a threshold voltage variation due to the aforementioned cause and a threshold voltage variation due to light have signs opposite to each other and progress at speeds nearly equal to each other will be considered. In this case, the threshold voltage can promptly adjusted by making both variations progress simultaneously.

Also, light irradiation of the semiconductor can be performed before or after the period of time in which a threshold voltage variation due to the aforementioned cause occurs. In other words, irradiation may be performed before the semiconductor device being driven or after termination of the driving. For example, the case where a threshold voltage variation due to the aforementioned cause and a threshold voltage variation due to light have signs opposite to each other and the latter progresses much more quickly than the former will be considered. In this case, the semiconductor can be used in a more stable condition by intermittently performing light irradiation for a short period of time before or after a long period of time in which the threshold voltage variation due to the aforementioned cause slowly progresses.

It is desirable that the semiconductor be sufficiently shielded from light with wavelengths shorter than the absorption edge wavelength. This is because the characteristics other than the threshold voltage will also greatly vary if the semiconductor is irradiated with light with short wavelengths. Also, as with light with long wavelengths, the effect of light with short wavelengths remains in the semiconductor even after shielding the semiconductor from the light with short wavelengths. Variation in various characteristics of the semiconductor during the semiconductor being irradiated with light with wavelengths shorter than the absorption edge wavelength can be considered as being related to the carrier densities of the valence band and the conduction band and the state of occupancy by in-gap states being largely varied by interband transition of carriers due to the light.

Also, a semiconductor to be subjected to light irradiation can have an in-gap state surface density of no more than $10^{13}$ $cm^{-2}$ $eV^{-1}$. Here, in-gap states, which are localized states in a semiconductor, can make the conduction band or the valence band generate free carriers, upon being subjected to light irradiation. A surface density is obtained by converting an in-gap state density into the surface density of an electric-conducting region of a semiconductor element (the interface between the gate insulation film and the semiconductor when the semiconductor element is a field-effect transistor such as a TFT).

A semiconductor with an in-gap state density exceeding $10^{13}$ $cm^{-2}$ $eV^{-1}$ has the following problem. It becomes impossible to ignore the process of exciting electrons (or holes) from the in-gap states to the conduction band (or the valence band) even upon irradiation with light with energy sufficiently smaller than (for example, about half of) that of the band gap. Accordingly, even upon being irradiated with light having wavelengths sufficiently longer than the absorption edge wavelength, the semiconductor unfavorably enters a state similar to the aforementioned state in which the values of the characteristics other than the threshold voltage have also been changed by irradiation with light having short wavelengths.

Furthermore, the semiconductor can have a band gap of no less than 1.55 eV. In this case, there are increased options of the measure for, when a light source emits continuous spectrum light, adjusting the wavelengths of the light relative to the absorption edge wavelength of the semiconductor so that the aforementioned conditions are met. For example, if photon energy for interband transition (absorption edge) is in the visible light range (wavelengths of no more than 800 nm), a commonly-used low-pass filter, which uses organic dyes for absorption, can be used as the dimming mechanism. Use of such low-pass filter as the dimming mechanism enables provision of a state in which the semiconductor is irradiated with light having wavelengths longer than the absorption edge wavelength of the semiconductor, while being effectively not irradiated with light having wavelengths shorter than the absorption edge wavelength.

Furthermore, the semiconductor can have a band gap of no less than 2 eV. When the semiconductor is used for a channel layer in a TFT, the lower limit of channel current leakage during the TFT being off is subject to the band gap of the semiconductor. More specifically, the lower limit Ioff of channel current leakage can be estimated by the following formula.

$$Ioff = q(ni(\mu e + \mu h)) \cdot (W/L) \cdot d \cdot Vds$$

Here, q is the elementary charge, ni is the intrinsic carrier density, i.e., $(NcNv)^{1/2} \cdot \exp(-Eg/2kT)$ (Nc: the state density of the conduction band edge, Nv: the state density of the valence band edge, Eg: the band gap, k: the Boltzmann constant, and T: the absolute temperature), $\mu e$ is the drift mobility of electrons, $\mu h$ is the drift mobility of holes, W is the channel width of the TFT, L is the channel length of the TFT, d is the thickness of the channel layer, and Vds is the drain-source voltage of the TFT.

The dependence of Ioff on Eg will be estimated according to the above formula. Where d=20 nm, W/L=4, and constants for monocrystalline silicon are employed for all the material constants other than Eg, if Eg is larger than around 2 eV, Ioff can be suppressed to around $10^{-18}$ A or less. When a potential is written or retained in a retention capacity (capacitance of 1 pF) in an active matrix pixel circuit through this TFT, variation in the written potential due to channel current leakage can be suppressed to 1 V or less even $10^6$ s(=11.5 days) later. This corresponds to display data retention for several days in the case of, for example, a TFT for a backplane for an active matrix-type display apparatus.

Examples of a semiconductor that can meet the aforementioned conditions include a semiconductor containing at least any of In, Ga, Zn and Sn.

Furthermore, at least a part of the semiconductor can be amorphous. This is because a semiconductor including amorphia is superior to a polycrystalline semiconductor in workability for etching, etc., and close range uniformity of the electric characteristics.

For an example of a semiconductor meeting all the aforementioned conditions, e.g., amorphous In—Ga—Zn—O (IGZO), amorphous In—Zn—O (IZO), amorphous Zn—Sn—O (ZTO) are known, and these semiconductor can be employed in the present invention.

Also, the semiconductor can contain: at least one type of element selected from elements belonging to groups I to XIV in the periodic table, and antimony and bismuth; and a number of oxygen atoms equal to or exceeding the total number of atoms for the element. Such types of semiconductor have widely been developed as oxide semiconductors, and IGZO, IZO and ZTO are included in the types of semiconductor. An oxide semiconductor in the present invention is a metal oxide. Metals mentioned here refer to metal elements, elements other than hydrogen, carbon, silicon and germanium from among elements belonging to groups I to XIV and bismuth. An oxide semiconductor meeting the aforementioned conditions contains at least one of these metal elements and oxygen. Also, hydrogen, carbon, silicon, germanium and antimony may be contained in the oxide semiconductor as additive elements for adjusting the physical properties of the semiconductor. These metal elements, and hydrogen, carbon, silicon, germanium and antimony become cations for forming the oxide semiconductor, and oxygen becomes anions. The total number of oxygen atoms contained in the oxide semiconductor can be obtained by (the total number of cations contained in the oxide semiconductor)×(average cation valence)/2. Where the average cation valence is +2, the total number of oxygen atoms becomes equal to the total number of the atoms for the cation elements, and where the average cation valence is smaller than +2, the total number of oxygen atoms becomes smaller than the total number of atoms for the cation elements. When an oxide is used as a semiconductor, a group-I oxide with a valence of +1 has an excessively strong ion binding property, resulting in the difficulty to generate carrier electrons, and accordingly, such oxide is rarely contained as a main component of the semiconductor. Also, a group-XI oxide having a valence of +1 easily becomes a p-type semiconductor, and is prone to be unstable for an oxide semiconductor. Meanwhile, many of the metal elements having a valence of +3 or +4 metal allow carrier electrons to be easily generated, and often used for constituent elements for an oxide semiconductor. Accordingly, the average cation valence of the oxide semiconductor can be determined to be no less than +2. In the present invention, an average cation valence of no less than +2 is provided by making the total number of oxygen atoms in the oxide semiconductor be equal to or exceed the total number of atoms for the cation elements.

Next, advantages of the semiconductor and semiconductor element that have been described above will be described based on more specific examples.

(1) Formation of a Semiconductor Thin Film

Hereinafter, an amorphous IGZO film, which is a semiconductor thin film, is formed as an example, and the physical properties of the film will be evaluated.

First, a substrate obtained by degreasing and cleansing a glass substrate (Corning 1737 manufactured by Corning Incorporated) is provided as a substrate for film deposition is formed. A polycrystal sintered compact having a composition of $InGaO_3(ZnO)$ (with a diameter of 75 mm, a thickness of 5 mm and an electrical conductivity of $0.25 \text{ S}\cdot\text{cm}^{-1}$) was used as a target material.

The total pressure of the inside of the deposition chamber during film deposition was made to 0.5 Pa with an oxygen-argon gas mixture containing 5 vol. % of oxygen. The distance between the target and the substrate for film deposition was 75 mm. Film deposition was performed with power supply of RF 200 W and a deposition rate of $1.2 \text{ Å}\text{s}^{-1}$. The substrate temperature was not specifically controlled.

The film deposited in a thickness of 60 nm was transparent when observed by the unaided eye. An X-ray is made to enter the film deposited in a thickness of 60 nm at an incident angle of 0.5 degrees relative to the measurement target surface to perform X-ray diffraction measurement using a thin film approach. Based on the fact that no clear diffraction peaks have been recognized, the formed In—Ga—Zn—O film was determined as being amorphous.

As a result of X-ray fluorescence (XRF) analysis, the metal composition ratio of the thin film was determined to be In:Ga:Zn=1:0.9:0.6.

Current-voltage measurement is performed by means of a coplanar electrode pattern using a laminated deposited film of titanium and gold to measure the electrical mobility of the thin film. The electrical mobility was approximately $1\times10^{-6}$ (S·cm$^{-1}$). Supposing that the electrical mobility is approximately 5 (cm$^2$·V$^{-1}$·s$^{-1}$), the electron carrier concentration can be estimated to be approximately $1\times10^{12}$ (cm$^{-3}$).

Through the process described above, it has been determined that: the formed In—Ga—Zn—O-based thin film was an oxide semiconductor amorphous IGZO containing In, Ga and Zn, at least a part thereof being amorphous.

(2) Fabrication of TFT

A TFT to which the present invention has been applied was fabricated through the following procedure. A cross-sectional view is illustrated in FIG. 2.

First, an n$^+$-silicon wafer (of 20 mm long, 20 mm wide and 0.525 mm thick) provided with a silicon thermal oxide film (with a film thickness of 100 nm) was cleansed to use the wafer as a substrate. Amorphous IGZO, which is a semiconductor, was deposited on this substrate by means of RF magnetron sputtering (sputtering gas: O$_2$(5 vol. %)+Ar, sputtering pressure: 0.5 Pa, power supply: 200 W, and film thickness: 20 nm). During sputter deposition, the substrate temperature was not specifically controlled. Subsequently, the amorphous IGZO was patterned to have a predetermined size by means of etching and used as a channel layer. Subsequently, the entire substrate was heated at 300° C. for 20 minutes in an air atmosphere. A photoresist film was formed and patterned on the substrate, and then titanium and gold were deposited in the total thickness of 100 nm by an electron beam evaporation technique, lift-off of the resist film is performed to form a source electrode and a drain electrode.

Through the above-described procedure, a TFT 129 including the conductive portion of the substrate as a gate electrode 124, the thermal oxide film as a gate insulation film 123, the amorphous IGZO as a channel layer 120, and a source electrode 121 and a drain electrode 122. The channel width W was 80 μm and the channel length L was 10 μm. When the transfer characteristic (Ids-Vgs characteristic: Ids=drain-source voltage, and Vgs=gate-source voltage) of this TFT were measured with a drain-source voltage Vds of +20 V, a clear n-channel characteristic was exhibited. The threshold voltage (Vth) and the saturation mobility (μsat) obtained by linear approximation of the √Ids-Vgs characteristic were 4.8 V and μsat=12.9 cm$^2$·V$^{-1}$·s$^{-1}$, respectively. The S value was 0.6 V·dec$^{-1}$.

(3) Effect of Light Irradiation of TFT

The effect of light irradiation of this TFT was studied. Light from a xenon lamp is guided to a grating spectrometer, and monochromated light is applied to the channel side of the TFT. The optical slit width of the spectrometer was 24 nm. The concentration of a neutral density (ND) filter inserted in the optical path was adjusted so that the irradiation intensity was 0.2 mW·cm$^{-2}$ for the respective wavelengths.

First, the TFT was irradiated with monochromatic light with a wavelength of 600 nm for 100 seconds, and then, while continuing the irradiation as it is, the transfer characteristic was measured with Vds of +0.5 V. Next, the TFT was irradiated with monochromatic light with a wavelength of 590 nm for 100 seconds in a similar manner, and then while continuing the irradiation, the transfer characteristic was measured in a similar manner. Subsequently, measurement was performed for respective wavelengths scanned per 10 nm until a wavelength of 300 nm was reached. The results were illustrated in FIG. 3. For ease of viewing, only transfer curves for every 50 nm such as irradiation light wavelengths of 600 nm, 550 nm, 500 nm . . . , were indicated. The transfer curve monotonically moved to the negative direction of Vgs as the wavelength of irradiation light became shorter. Furthermore, the shapes of the curves varied on the short wavelength side.

Next, the movement of the transfer curve and the variation in the curve shape were further studied in details. A rising voltage (Von: Vgs providing Ids exceeding $1\times10^{-1}$ A) can be considered as a characteristic index of the same type as Vth. Von and an S value (the reciprocal of the inclination of the Log(Ids)–Vgs curve around Von) are obtained for the respective wavelengths and plotted relative to the wavelengths, obtaining FIGS. 4 and 5. It can be seen that both Von and the S value exhibited drastic variation with the irradiation light wavelength of around 360 nm as the boundary.

For the irradiation light wavelength of 360 nm or more, the variation of S value does not exceed a value of around a measurement error. In fact, no substantial variation in the shape of the transfer curve can be seen for the irradiation light wavelength of 360 nm or more, and thus, it has been recognized that the transfer curve can be regarded as exhibiting parallel movement of the transfer characteristic measured in a dark condition. Meanwhile, the S value exhibited drastic variation with 360 nm as the boundary. This indicates that the waveform of the transfer curve varies on the side of wavelengths shorter than 360 nm.

The parallel movement of the transfer curve on the side of wavelengths longer than 360 nm can be considered as release of negative fixed charges trapped in in-gap states distributed in the semiconductor or the neighborhood thereof. Meanwhile, the mechanism of transfer characteristic variation exhibited for the wavelengths shorter than 360 nm has not been clarified. It can be guessed that the variation is probably related to large variation in the carrier densities of the valence band and/or the conduction band and the state of occupancy by the in-gap states due to interband transition of free carriers caused by light.

(4) Estimation of In-Gap State Density

Hereinafter, the surface density ΔNt (cm$^{-2}$·eV$^{-1}$) of in-gap states related to the parallel movement of the transfer characteristic will be estimated.

Figure 4:
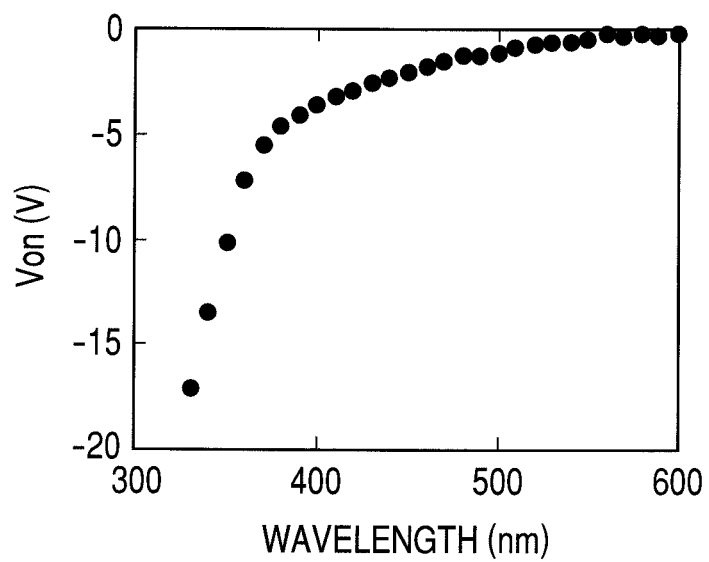
FIG. 4 is a diagram illustrating the dependence of a rising voltage on an irradiation light irradiation wavelength in the transfer characteristic of a TFT to which the present invention can be applied.
Figure 5:
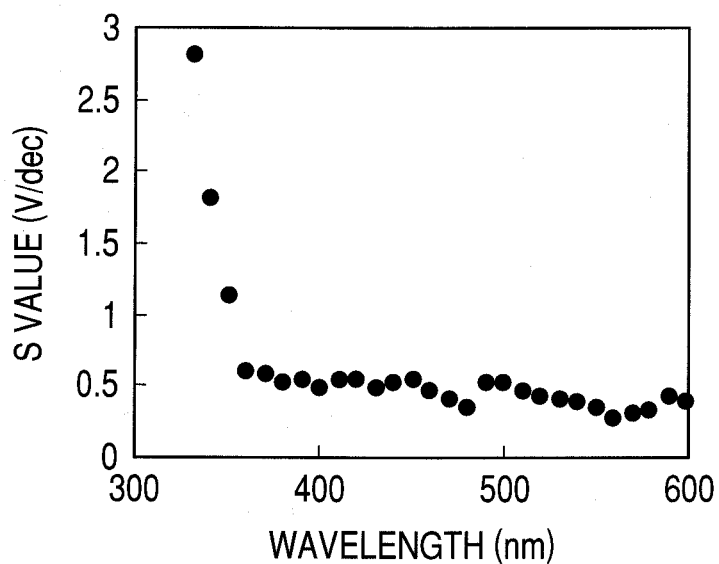
FIG. 5 is a diagram illustrating the dependence of an value on an irradiation light wavelength in the transfer characteristic of a TFT to which the present invention can be applied.

Based on FIG. 4, the Von variation amount ΔVon when the irradiation light wavelength λ is moved to the shorter wavelength side by 10 nm is calculated as a function of λ(360 nm≦λ≦600 nm). It can be considered that each time λ is varied by 10 nm, fixed charges that have not been released by excitation caused by photo energy for wavelengths lower than the relevant wavelength are newly released, resulting in variation in Von. The surface density ΔNf (cm$^{-2}$) of the newly-released fixed charges can be expressed as follows, using ΔVon, the gate insulation film capacity Ci (F·cm$^{-2}$), and the elementary charge q (C).

$$\Delta Nf = Ci \cdot |\Delta Von|/q$$

Taking a correction for the increment (hv) of irradiation photo energy for each λ sweep step into account, the surface density ΔNt (cm$^{-2}$·eV$^{-1}$) of localized states involved in fixed charge emission can be expressed as follows.

$$\Delta Nt = \Delta Nf/\Delta(hv) = \Delta Nf/\Delta(hc/\lambda)$$

Here, h is Planck's constant, and c is the speed of the light in vacuum (variation in the number of applied photons caused by variation in λ has been ignored: the variation causes an error of twofold or so between both ends of the λ sweep range at the most).

Figure 6:
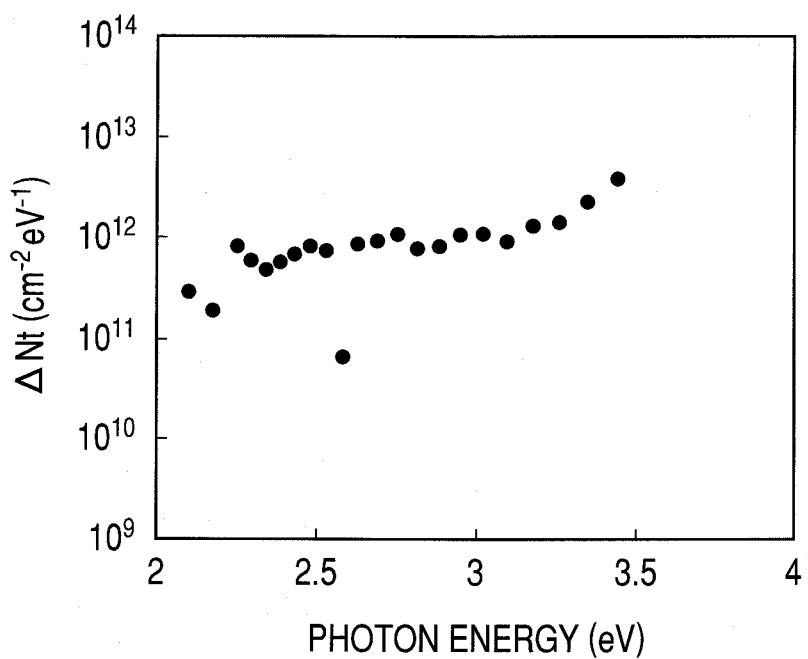
FIG. 6 is a diagram illustrating the dependence of the surface density of a localized state involved in fixed charge emission in a TFT to which the present invention can be applied.

FIG. 6 illustrates ΔNt plotted relative to the applied photo energy. This can be considered indicating the state density based on energy EC at the upper edge of the valence band in the semiconductor.

From the above analysis, ΔNt(E) from EC+2 (eV) to EC+3.4 (eV) for the energy E in this amorphous IGZO can be estimated to be approximately no more than $10^{13}$ cm$^{-2}$·eV$^{-1}$.

Although it has not yet been possible to specify the parts where the aforementioned in-gap states exist, if the in-gap states are distributed in the semiconductor bulk, the in-gap states can be evaluated in terms of volume density ΔNt' (cm$^{-3}$·eV$^{-1}$). The volume density can be estimated as follows, with d (cm) as the film thickness of the semiconductor.

$$\Delta Nt' = \Delta Nt/d$$

In other words, for a semiconductor film with a film thickness of 10 nm, ΔNt=$10^{13}$ (cm$^{-2}$·eV$^{-1}$) corresponds to ΔNt'=$10^{19}$ (cm$^{-3}$·eV$^{-1}$).

(5) Characteristic Recovery by Means of Light Irradiation of Semiconductor Elements During a Period of Time in Which a Threshold Voltage Variation is Occurring The threshold voltage is changed by performing light irradiation during a period of time in which a threshold voltage variation due to electrical stress is occurring.

First, the absorption edge wavelength of an amorphous IGZO semiconductor was estimated as follows. An amorphous IGZO semiconductor was deposited in thickness of 20 nm on an n$^+$-silicon wafer substrate provided with a silicon thermal oxide film (with a film thickness of 100 nm) under conditions similar to those mentioned in the exemplary embodiment section. The phase difference and amplitude ratio between reflected p-polarized light and reflected s-polarized light was obtained by ultraviolet-visible spectroscopic ellipsometry. Furthermore, providing Tauc-Lorentz-type absorption and Gaussian-type absorption as the fundamental (inter-band edges) absorption and the tail (subband) absorption, respectively, fitting analysis of the extinction coefficient and the refractive index is performed so as to satisfy a Kramers-Kronig relation. Consequently, a value of 3.5 eV (=354 nm) was obtained as the absorption edge of the fundamental absorption, that is, the optical band gap of this substance.

Next, a TFT using an amorphous IGZO semiconductor similar to the aforementioned one as a channel layer was fabricated through the following procedure. First, amorphous IGZO, which becomes a semiconductor, was deposited on an n$^+$ silicon wafer substrate provided with a silicon thermal oxide film (with a film thickness of 100 nm), under the same condition as those mentioned above, and was patterned by etching to have a predetermined size. Subsequently, the entire substrate was heated in an air atmosphere at 300° C. for 20 minutes. Titanium and gold were deposited by an electron beam evaporation technique in the total thickness of 100 nm, and patterned source and drain electrodes were formed by lift-off.

Figures 7, 8:
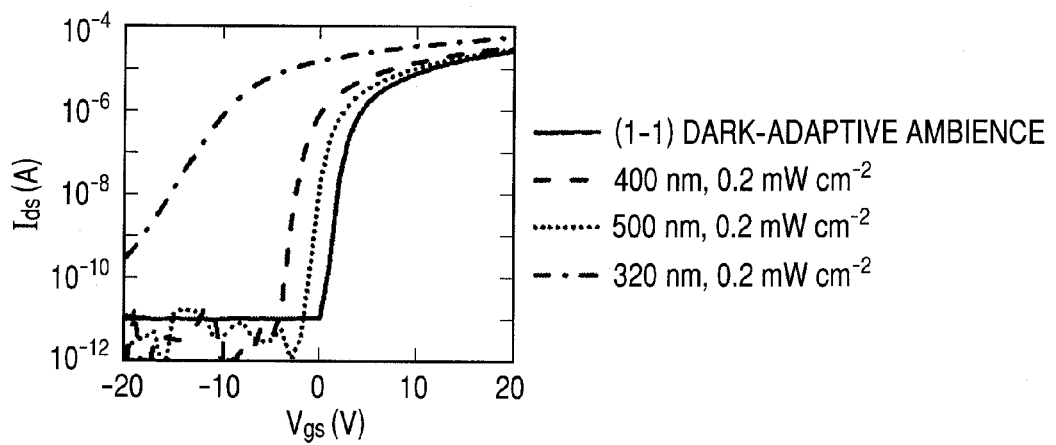
FIG. 7 is a diagram illustrating characteristic variations in a semiconductor element upon light irradiation of the semiconductor element.
FIG. 8 is a diagram illustrating characteristic variations in a semiconductor element upon light irradiation of the semiconductor element.

Four example TFT elements were fabricated through the above-described procedure, and the transfer characteristic of each TFT element was measured in a dark-adaptive ambience with Vds of +20 V. A solid line (1-1) in FIG. 7 indicates a representative result of measuring the transfer characteristics of these TFTs in a dark-adaptive ambience with Vds of +20 V. Furthermore, FIG. 8 illustrates TFT characteristics (Vth, μsat and S value) obtained from the above result. Next, a voltage providing Vds of +0.1 V and Vgs of +20 V was applied to each TFT as electrical stress for 1800 seconds. During the application, the TFT were irradiated with monochromatic light under the below conditions that are different depending on the TFT for 1800 seconds.

(2-1) No light irradiation
(2-2) 400 nm, 0.02 mW/cm$^2$
(2-3) 400 nm, 0.2 mW/cm$^2$
(2-4) 600 nm, 0.2 mW/cm$^2$ Subsequently, the light irradiation was stopped, and the transfer characteristic of each TFT was measured in a dark-adaptive ambience with Vds of +20 V.

Figure 9:
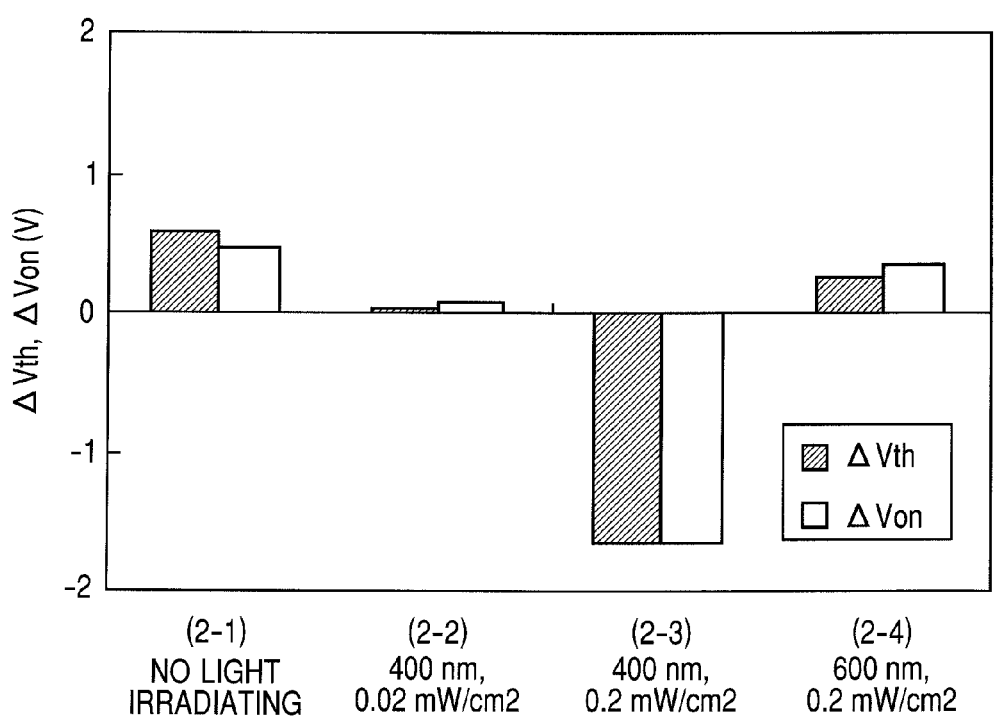
FIG. 9 is a diagram illustrating recovery of characteristics of semiconductor elements upon light irradiation of the semiconductor elements during a period of time in which a threshold voltage variation is occurring.

Vth, Von, μsat and an S values were figured out from the respective transfer characteristics measured before and after the application of electrical stress. From among the values, Vth and Von variations ΔVth(V) and ΔVon(V) due to the stress are illustrated in FIG. 9. In each case, μsat and S value variations before and after the application of electrical stress were less than 2% and less than 6%, respectively, relative to their initial values.

As described above, the threshold voltages of the semiconductor elements were able to be varied. Also, as can be seen in (2-2), a threshold voltage variation of the semiconductor element caused by the electrical stress was able to be compensated. Also, as can be seen in (2-3), the effect of a threshold voltage variation of the semiconductor element caused by the electrical stress was able to be relatively decreased. Also, as can be seen in (2-4), a threshold voltage variation of the semiconductor element caused by the electrical stress was able to be suppressed. Considering (2-4) in combination with (2-3), it can be considered that a further precise compensation can be made by selecting proper wavelengths for the irradiation light while the intensity of the irradiation light being maintained.

Furthermore, in all of the above-described examples, the characteristics of the semiconductor element other than the threshold voltage (such as the charge mobility and the S value) were able to be maintained at values equal to those before the application of electrical stress and the light irradiation.

Figure 10:
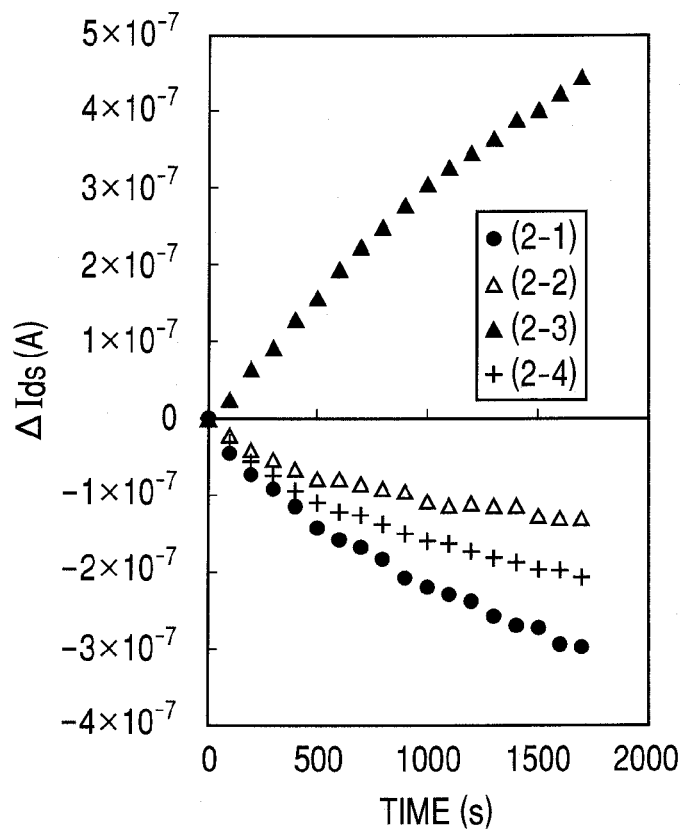
FIG. 10 is a diagram illustrating recovery of characteristics of semiconductor elements upon light irradiation of the semiconductor elements during a period of time in which a threshold voltage variation is occurring.

FIG. 10 illustrates temporal Ids changes ΔIds measured for these TFT elements during being subjected to electrical stress application. ΔIds indicates increase/decrease relative to current Ids at the time of staring light irradiation (or voltage application) (time t=0).

From the changes, the threshold voltage of the respective TFTs at an arbitrary time can be figured out. Since only Vth is varied by light irradiation while the field effect mobility being kept constant, all the variations in Ids attribute to variations in Vth. Accordingly, Vth at an arbitrary time can be figured out according to the following formula.

$$Ids=(W/L)\mu linCi(Vgs-Vth)Vds$$

Here, W is the channel width, L is the channel length, μlin is the linear mobility and Ci is the gate insulation film capacity (F·cm$^{-2}$).

Figure 11:
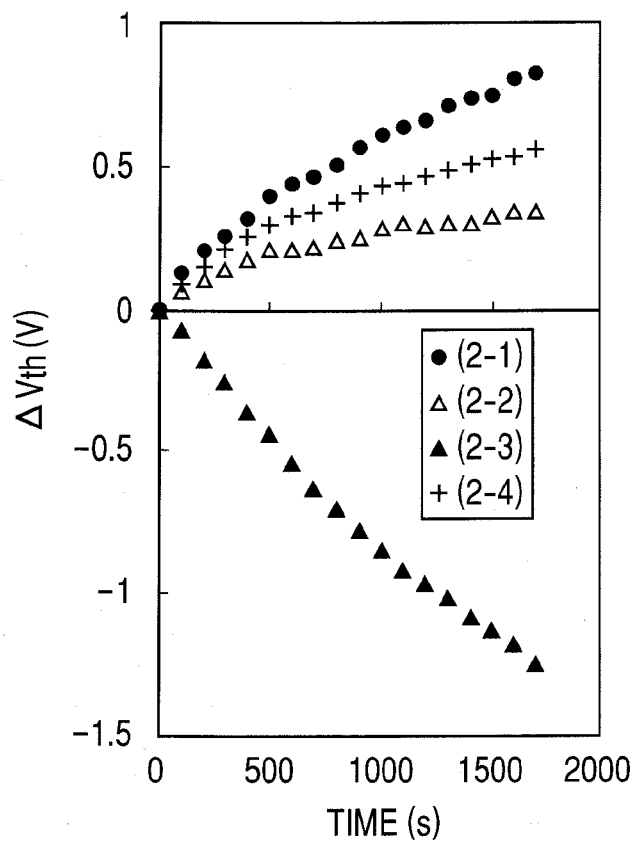
FIG. 11 is a diagram illustrating recovery of characteristics of semiconductor elements upon light irradiation of the semiconductor elements during a period of time in which a threshold voltage variation is occurring.
Figure 12A:
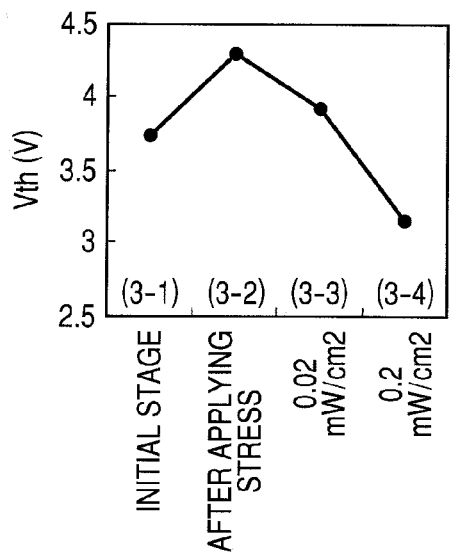
FIGS. 12A, 12B, 12C and 12D include diagrams illustrating recovery of characteristics of semiconductor elements upon light irradiation of the semiconductor elements after a period of time in which a threshold voltage variation occurs.
Figure 12B:
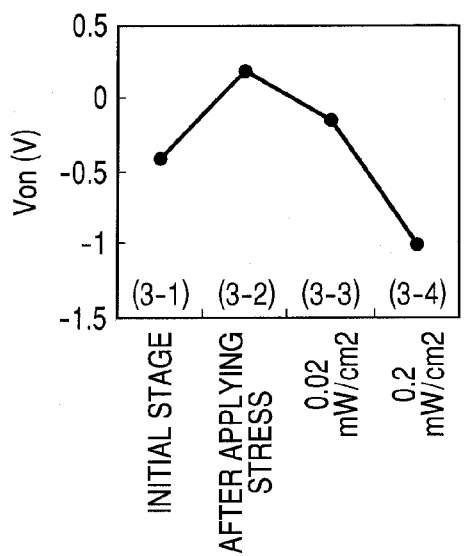
Figure 12C:
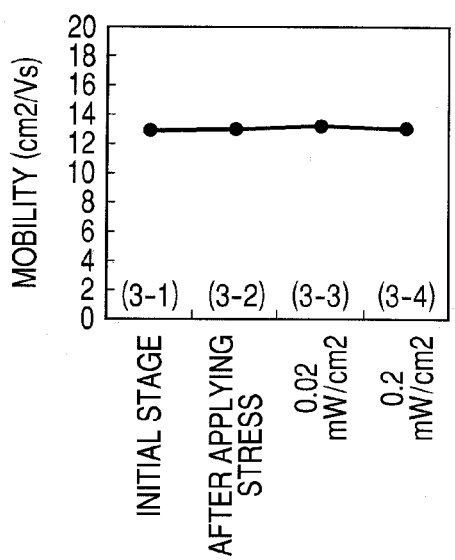
Figure 12D:
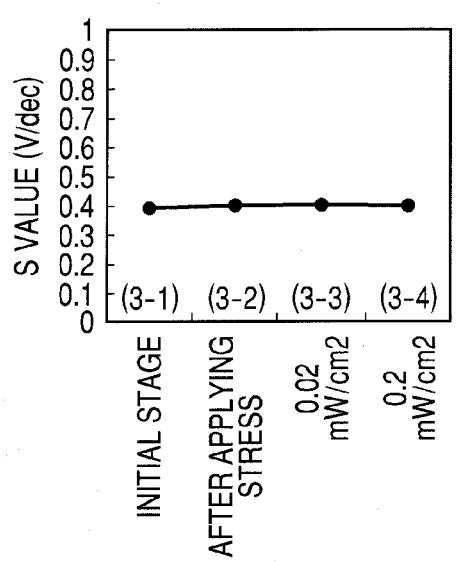

FIG. 11 illustrates the results of figuring out Vth variation amounts ΔVth from t=0 supposing that μlin is equal to μsat. For example, in the condition in which Ids gradually increases (2-3), Vth decreases with time.

(6) Characteristic Recovery by Means of Light Irradiation of the Semiconductor Elements After the Period of Time in Which a Threshold Voltage Variation Occurs A threshold voltage can be varied by performing light irradiation after the period of time in which a variation in the threshold voltage occurs due to electrical stress.

Transfer characteristics (3-1) to (3-4) of with TFTs similar to those in the above-described examples were sequentially measured thought the following procedure.

A) The transfer characteristic (3-1) was measured in a dark-adaptive ambience with Vds of +20 V;

B) A voltage providing Vds of +20 V and Vgs of +20 V was applied in a dark-adaptive ambience as electrical stress for 3600 seconds;
C) The transfer characteristic (3-2) was measured in a dark-adaptive ambience in a manner similar to the above;
D) Monochromatic light was applied under conditions of (400 nm, 0.02 mW·cm$^{-2}$ and 100 sec.);
E) The transfer characteristic (3-3) was measured in a dark-adaptive ambience;
F) Monochromatic light was applied under conditions of (400 nm, 0.2 mW·cm$^{-2}$ and 100 sec.); and
G) The transfer characteristic (3-4) was measured in a dark-adaptive ambience dark-adaptive ambience.

The Vth, Von, μsat and S values obtained from the respective transfer characteristics are illustrated in FIGS. 12A to 12D.

Although Vth and Von were increased by the electrical stress, they were able to be decreased by the subsequent light irradiation. During the irradiation, the mobility and the S value exhibited variations of less than 2% and less than 4%, respectively.

As described above, the threshold voltages of the semiconductor elements were able to be varied. Also, as can be seen in (3-1) to (3-3), a threshold voltage variation of the semiconductor element caused by electrical stress was able to be suppressed. Also, as can be seen in (3-1) to (3-4), the effect of a threshold voltage variation of the semiconductor element caused by electrical stress was able to be relatively decreased. Furthermore, a threshold voltage variation of the semiconductor element caused by electrical stress was able to be compensated by selecting proper conditions from among those described above.

Furthermore, in all of the above-described examples, the characteristics of the semiconductor element other than the threshold voltage (such as the charge mobility and the S value) were able to be maintained at values equal to those before the application of electrical stress and the light irradiation.

(7) Characteristic Recovery by Means of Light Irradiation of Semiconductor Elements Before the Period of Time in Which a Threshold Voltage Variation Occurs A threshold voltage can be varied by performing light irradiation before the period of time in which a variation in the threshold voltage occurs due to electrical stress.

The transfer characteristics of TFTs similar to those in the above-described examples were measured in a dark-adaptive ambience with Vds of +20 V. Next, after application of light with the wavelength and intensity illustrated in (4-2) in FIG. 13, the transfer characteristics were measured in a dark-adaptive ambience in a manner similar to the above. Subsequently, after application of voltages Vds and Vgs in a dark-adaptive ambience as electrical stress under the conditions illustrated in (4-3) in FIG. 13, the transfer characteristics were measured again in a dark-adaptive ambience. The TFT characteristics obtained as a result of the above measurement were illustrated in FIG. 13.

As described above, the threshold voltages of the semiconductor elements were able to be varied. A threshold voltage variation of the semiconductor element caused by electrical stress was able to be suppressed. Furthermore, the characteristics of the semiconductor element other than the threshold voltage (such as the charge mobility and the S value) were able to be maintained at values equal to those before the processing.

Lastly, exemplary embodiments of a semiconductor device according to the present invention, which uses the above-described semiconductor, will be described in details with reference to the drawings.

(First Exemplary Embodiment)

First, as a first exemplary embodiment of the semiconductor device, an exemplary embodiment of the present invention being employed in an image display apparatus, here, a liquid-crystal display (LCD) will be described below. The LCD includes a backlight light source therein. The backlight light source can be used as a light source for the present exemplary embodiment. Since most of the other display apparatuses also include a light source, the light source can be used as a light source for the present invention. For example, in the case of an organic EL display, light emitted from an organic EL layer can be used as a light source for the present invention. It should be understood that: a separate light source for the present invention may be provided, rather than using such light source; and a method of, e.g., using light from the environment as a light source may be employed. In the case of reflective display apparatuses and other apparatuses not having a light source, it is desirable to separately provide a light source or use light from the environment.

Figure 14:
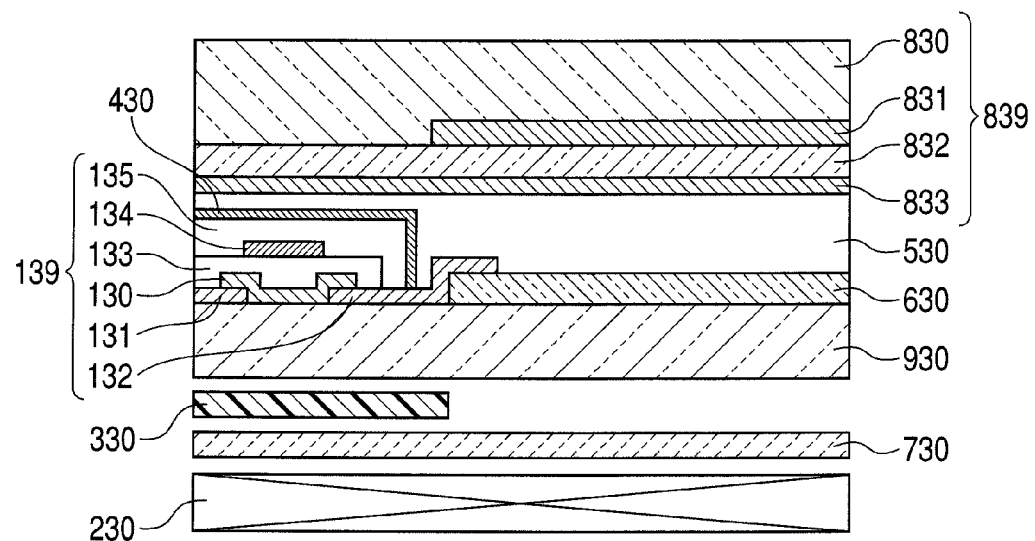
FIG. 14 is a schematic diagram of a first exemplary embodiment of the present invention.

FIG. 14 illustrates a schematic structure of an LCD using the present invention. A top-gate TFT 139 using an amorphous IGZO semiconductor thin film for a channel layer 130 is fabricated on a glass substrate 930. The TFT structure in this case is not limited to a top-gate structure, and may be a bottom-gate structure or another structure. One of a source 131 and a drain 132 is connected to a transparent electrode 630 adjacent to the TFT. A gate insulation film 133 is provided on the channel layer, a gate electrode 134 is further provided on the gate insulation film 133, and a protective film 135 is further provided over the gate electrode 134, thereby forming the TFT 139. A light-blocking film 430 is arranged above the TFT 139 so as to cover the TFT. The light-blocking film 430 is provided to prevent external light such as light from the environment or scattered light from the backlight unit 230, which will be described later, from entering the TFT from the upper part of the TFT, causing variation in the TFT characteristics. It is desirable that the light-blocking film 430 include a metal film or a silicon film. Alternatively, a colored resin or the like may be used for the light-blocking film 430.

A color filter substrate 839 is arranged above the glass substrate on which the transparent electrode 630 and the TFT 139 have been formed with a space secured via spacers or the like. The color filter substrate 839 includes, e.g., a glass substrate 830, a color filter 831, a transparent electrode 832 and an alignment film 833. Liquid crystal is charged in the space between the color filter substrate 839, and the transparent electrode 630 and the TFT 139, and thus, the space forms a liquid-crystal layer 530.

The backlight unit 230 is provided below the glass substrate on which the TFT 139 has been formed, and a polarizing plate 730 is arranged between the glass substrate 930 and the backlight unit. Furthermore, a color filter 330 is provided between the backlight unit 230 and the TFT 139 as a dimming mechanism. It is only necessary that the color filter 330 be positioned between the TFT 139 and backlight unit 230 and in a part of the optical path of light applied to the TFT 139 from the backlight unit 230. In other words, the color filter 330 may be positioned between the glass substrate 930 on which the TFT 139 has been formed and the polarizing plate 730, or between the polarizing plate 730 and the backlight unit 230. As a result of provision of this color filter 330, a majority of light applied from the light backlight unit 230 to the TFT 139 is light that has passed through the color filter 330.

For the color filter 330, a low-pass filter utilizing, e.g., absorption by organic dyes can be used. With this filter, light with short wavelengths of approximately no more than 350 nm, which is the absorption edge wavelength of the amorphous IGZO semiconductor thin film used for the channel layer 130, in the light emitted from the backlight unit 230 is removed, and the channel layer 130 is irradiated only with light having wavelengths longer than 350 nm.

During operation of the LCD apparatus, TFTs in the respective pixels are operating, and the TFT characteristics vary due to stress caused by gate voltage application due to the operation or thermal stress caused by an increase in the temperature of the inner environment of the LCD apparatus. During operation of the LCD apparatus, the backlight unit 230 is on, too. Thus, light from the backlight unit passes through the color filter 330, and the TFTs are irradiated with light having wavelengths longer than the absorption edge wavelength of the semiconductor during the operation of the TFTs. As described above, a TFT characteristic variation during driving of the apparatus can be suppressed or compensated, or the TFTs can recover to be in a state close to a state with characteristics before the driving, by the semiconductor being irradiated with light having wavelengths longer than the absorption edge wavelength of the semiconductor during operation of the LCD apparatus.

Furthermore, it is also possible that after termination of the driving of the LCD apparatus, the backlight unit 230 is maintained to be on for a while with the TFT 139 off, and during that time, the TFT is irradiated with light having wavelengths longer than the absorption edge wavelength of the semiconductor. Consequently the TFT characteristics that have been varied during the LCD apparatus operating can recover to be in a state close to the state before the variation.

Furthermore, it is possible that before start of the driving of the LCD apparatus, the backlight unit 230 is maintained to be on for a while with the TFT 139 off in advance, and during that time, the TFT is irradiated with light having wavelengths longer than the absorption edge wavelength of the semiconductor. Consequently, a variation opposite to a variation during operation of the apparatus is made to occur in the TFT characteristics. Subsequently, the LCD apparatus is made to operate, enabling the TFT characteristics to be in a state close to the characteristics before light irradiation by means of electrical stress, thermal stress or the like. Consequently, the TFT can be driven with its favorable characteristics kept as they are even existence of stress during the operation of the apparatus.

(Second Exemplary Embodiment)

Next, as a second exemplary embodiment of the semiconductor device, another exemplary embodiment using the present invention for a liquid-crystal display (LCD) will be described below. The present exemplary embodiment is characterized in that where the intensity of a light source included in the apparatus is excessively high for the target, scattered light is applied to the semiconductor rather than directly applying light from the light source.

Figure 15:
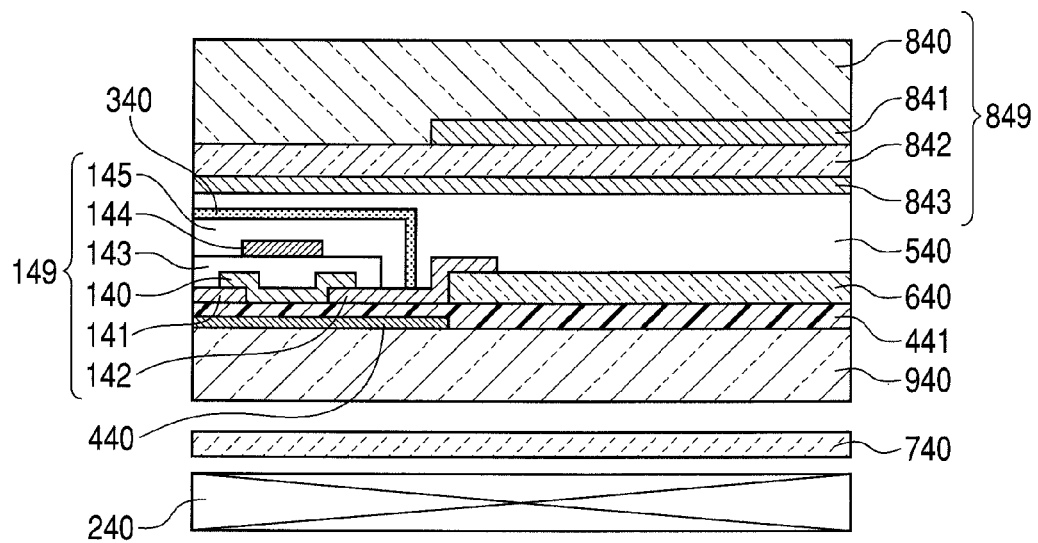
FIG. 15 is a schematic diagram of a second exemplary embodiment of the present invention.

FIG. 15 illustrates a schematic structure of an LCD using the present invention. A light-blocking film 440 is formed on a glass substrate 940, and an insulating film 441 is formed over the light-blocking film 440 to fabricate a TFT 149 using an amorphous IGZO semiconductor thin film for a channel layer 140 above the part provided with the light-blocking film. One of a source 141 and a drain 142 is connected to a transparent electrode 640 provided adjacent to the TFT. A gate insulation film 143 is provided on the channel layer, a gate electrode 144 is further provided on the gate insulation film 143, and a protective film 145 is further provided on the gate electrode 144, thereby forming the TFT 149. A color filter 340 is arranged on the TFT so as to cover the TFT 149.

Furthermore, as in the first exemplary embodiment, a color filter substrate 849 including, e.g., a glass substrate 840, a color filter 841, a transparent electrode 842 and an alignment film 843, a transparent electrode 640, a liquid-crystal layer 540, a backlight unit 240 and a polarizing plate 740, etc., are arranged.

Direct light from the backlight unit 240 is blocked by the light-blocking film 440, and thus, is not directly applied to the channel layer 140. Also, scattered light from the backlight unit passes through the color filter 340 provided on the TFT, and thus, is applied to the channel layer 140 in a state in which the light is adjusted to have wavelengths longer than the absorption edge wavelength of the semiconductor. Consequently, a variation in the TFT characteristics during driving of the apparatus can be suppressed or compensated, or the TFT can be made to recover to be in a state close to the state with the characteristics before the driving characteristics.

(Third Exemplary Embodiment)

Next, as a third exemplary embodiment of the semiconductor device, a still another exemplary embodiment using the present invention for a liquid-crystal display (LCD) will be described below. In the present exemplary embodiment a characteristic variation during driving of a semiconductor element is detected while performing light irradiation with the intensity, time and wavelengths of the irradiation light varied according to the amount of the characteristic variation, enabling recovery of the characteristics of the semiconductor element to a state close to the state before the variation.

Figure 16:
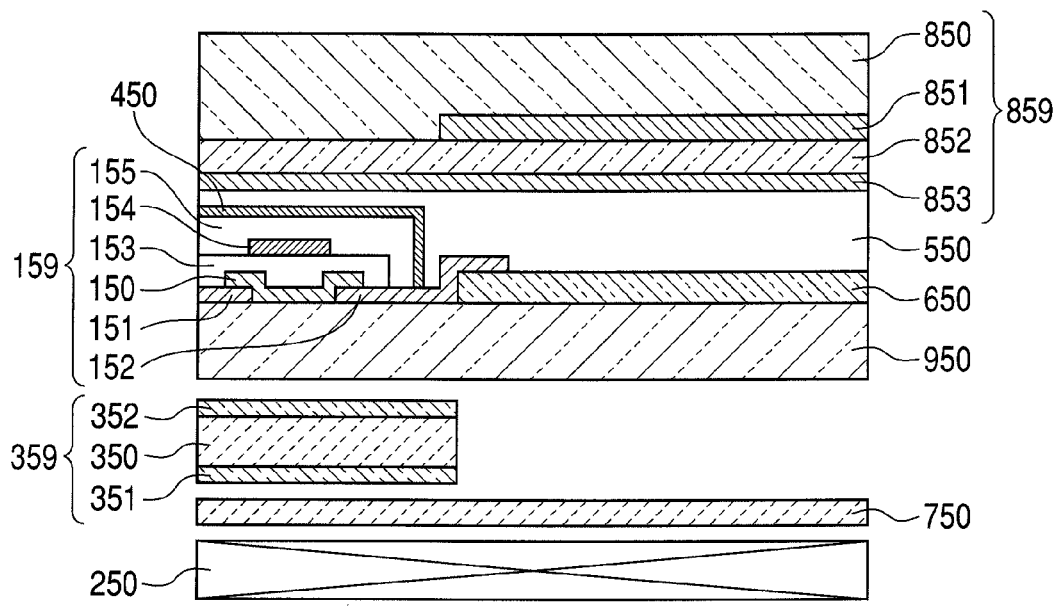
FIG. 16 is a schematic diagram of a third exemplary embodiment of the present invention.

FIG. 16 illustrates a schematic structure of an LCD using the present invention. A TFT 159 using an amorphous IGZO semiconductor thin film for a channel layer 150 is fabricated on a glass substrate 950. One of a source 151 and a drain 152 is connected to a transparent electrode 650 provided adjacent to the TFT. A gate insulation film 153 is provided on the channel layer, a gate electrode 154 is further provided on the gate insulation film 153, and a protective film 155 is further provided over the gate electrode 154, thereby forming the TFT 159. A light-blocking film 450 is arranged on the TFT 159 so as to cover the TFT.

A color filter substrate 859 including, e.g., a glass substrate 850, a color filter 851, a transparent electrode 852 and an alignment film 853, is arranged above a glass substrate on which the transparent electrode 650 and TFT 159 have been formed with a space secured via spacers or the like. Liquid crystal is charged in the space between the color filter substrate 859, and the transparent electrode 650 and the TFT 159, and thus, the space forms a liquid-crystal layer 550.

A backlight unit 250 is provided below the glass substrate on which the TFT 159 has been formed, and a polarizing plate 750 is provide between the glass substrate 950 and the backlight unit. Furthermore, a liquid-crystal layer 350 sandwiched between transparent electrodes 351 and 352 is provided between the backlight unit 250 and the TFT 159 as a dimming mechanism 359. A color filter such as a high-cut filter including common organic materials is provided above or below the dimming mechanism. For the dimming mechanism 359, an electrochromic element or a dielectric element having an electro-optic effect can be used instead of the liquid-crystal layer 350. These elements all enable the intensity, polarization state and wavelengths of transmitted light to be varied by a voltage applied between the transparent electrodes 351 and 352. As a result of combination of the dimming mechanism 359 and the polarizing plate 750, a polarization state variation becomes a variation equivalent to a transmitted light intensity variation. Adjustment of transmitted light by the dimming mechanism 359 can be controlled so as to successively vary the intensity to provide light with a proper intensity. Control can also be performed so as to substantially block transmitted light like opening/closing of an optical shutter.

It is only necessary that the dimming mechanism 359 be positioned between the TFT 159 and the backlight unit 250 and in a part of the optical path of light applied from the backlight unit 250 to the TFT 159. In other words, the dimming mechanism may be positioned between the glass substrate 950 on which the TFT 159 has been formed, and the polarizing plate 750, or between the polarizing plate 750 and the backlight unit 250.

Figure 17:
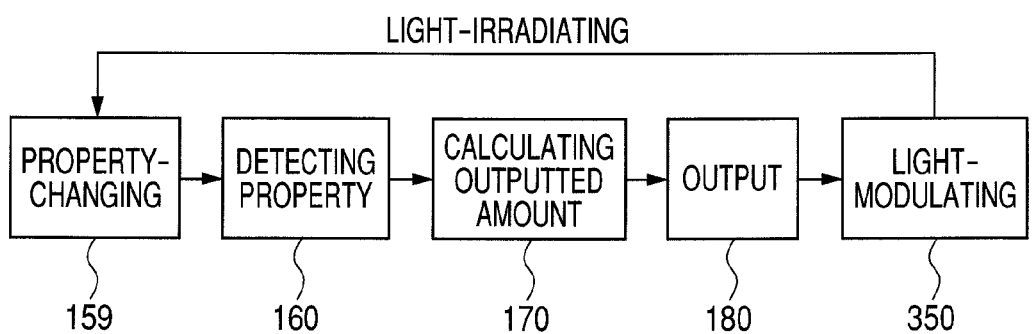
FIG. 17 is a diagram illustrating a concept of TFT characteristic variation detection and light irradiation adjustment based thereon.

As illustrated in FIG. 17, the TFT 159 is connected to a mechanism 160 for detecting TFT characteristics, and an arithmetic mechanism 170 determines the value of a voltage output to the dimming mechanism, based on the detected TFT characteristics. Then, an output mechanism 180 applies a voltage to the transparent electrodes 351 and 352 of the dimming mechanism 359 to irradiate the semiconductor with light suitable for recovering the semiconductor characteristics. Consequently, a TFT characteristic variation during driving of the apparatus can be suppressed or compensated, or the TFT can be made to recover to be in a state close to the state with the characteristics before the driving.

Although exemplary embodiments of a semiconductor device using the present invention have been described taking an LCD as an example, semiconductor devices to which the present invention can be applied are not limited to the above exemplary embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-124858, filed May 12, 2008, which is hereby incorporated by reference herein in its entirety.

The invention claimed is:

1. A semiconductor device comprising:
    a semiconductor element including a semiconductor as a component;
    a mechanism for irradiating the semiconductor with light having a wavelength longer than an absorption edge wavelength of the semiconductor; and
    a dimming mechanism included in the semiconductor element, provided in a part of an optical path through which the light passes, for adjusting at least one selected from the intensity, irradiation time and wavelength of the light,
    wherein a threshold voltage of the semiconductor element is varied by the light adjusted by the dimming mechanism, and
    wherein the semiconductor is of amorphous In—Ga—Zn—O (IGZO), amorphous In—Zn—O (IZO) or amorphous Zn—Sn—O (ZTO).

2. The semiconductor device according to claim 1, wherein the dimming mechanism absorbs or blocks light with a wavelength shorter than the absorption edge wavelength of the semiconductor.

3. The semiconductor device according to claim 1, wherein the dimming mechanism is provided between a light source for light irradiation and the semiconductor.

4. The semiconductor device according to claim 1, wherein the dimming mechanism includes one element selected from a liquid-crystal element, an electrochromic element, a color filter and an electro-optic effect element.

5. The semiconductor device according to claim 1, further comprising a mechanism for detecting the semiconductor element characteristic connected to the semiconductor element,
    wherein the dimming mechanism detects a variation in the threshold voltage of the semiconductor element via the mechanism for detecting the semiconductor element, and adjusts the light based on the detected variation.

6. The semiconductor device according to claim 1, wherein the light irradiation is performed before driving of the semiconductor device.

7. The semiconductor device according to claim 1, wherein the light irradiation is performed during driving of the semiconductor device or after termination of the driving.

8. The semiconductor device according to claim 1, wherein the semiconductor element includes at least a gate electrode, a source electrode, a drain electrode, a channel layer and a gate insulation film; and the semiconductor is the channel layer.

9. The semiconductor device according to claim 1, wherein a surface density of in-gap states in the semiconductor is no more than $10^{13}$ cm$^{-2}$ eV$^{-1}$.

10. The semiconductor device according to claim 1, wherein the semiconductor is a semiconductor with a band gap of no less than 1.55 eV.

11. A display apparatus comprising: a semiconductor device as a display device, comprising:
    as a display device, comprising:
        a semiconductor element including a semiconductor as a component,
        a mechanism for irradiating the semiconductor with light having a wavelength longer than an absorption edge wavelength of the semiconductor; and
        a dimming mechanism included in the semiconductor element, provided in a part of an optical path through which the light passes, for adjusting at least one selected from the intensity, irradiation time and wavelength of the light; and
        a drive element for driving the display device,
        wherein a threshold voltage of the semiconductor element is varied by the light adjusted by the dimming mechanism, and
        wherein the semiconductor is of amorphous In—Ga—Zn—O (IGZO), amorphous In—Zn—O (IZO) or amorphous Zn—Sn—O (ZTO).

12. The display apparatus according to claim 11, wherein the display apparatus is an image display apparatus, and the mechanism for irradiating the semiconductor with light includes a backlight light source.

13. The display apparatus according to claim 11, wherein the semiconductor element includes a thin-film transistor which comprises a gate electrode, gate insulation film, a source electrode, a drain electrode and the semiconductor as a channel layer, the thin-film transistor is connected to a mechanism for detecting a TFT characteristic of the thin-film transistor, and the dimming mechanism adjusts the light based on the TFT characteristic detected by the mechanism for detecting a TFT characteristic.

14. The semiconductor device according to claim 2, wherein the dimming mechanism is provided between the mechanism for irradiating the semiconductor with light and the semiconductor.

15. The semiconductor device according to claim 14, wherein the dimming mechanism includes one element selected from a liquid-crystal element, an electrochromic element, a color filter and an electro-optic effect element.

* * * * *